United States Patent [19]

Hansen et al.

[11] Patent Number: 5,976,247

[45] Date of Patent: *Nov. 2, 1999

[54] SURFACE-TREATED CRUCIBLES FOR IMPROVED ZERO DISLOCATION PERFORMANCE

[75] Inventors: Richard L. Hansen, Cleveland, Ohio; Larry E. Drafall, St. Charles, Mo.; Robert M. McCutchan; John D. Holder, both of St. Louis, Mo.; Leon A. Allen, Grover, Mo.; Robert D. Shelley, Chesterland, Ohio

[73] Assignee: MEMC Electronic Materials, Inc., St. Peters, Mo.

[ * ] Notice: This patent issued on a continued prosecution application filed under 37 CFR 1.53(d), and is subject to the twenty year patent term provisions of 35 U.S.C. 154(a)(2).

[21] Appl. No.: 08/490,465

[22] Filed: Jun. 14, 1995

[51] Int. Cl.$^6$ .................................................. C30B 35/00
[52] U.S. Cl. ............................... 117/200; 117/213; 65/33; 65/DIG. 8; 427/376.2
[58] Field of Search ........................... 117/2, 223; 65/33, 65/173, DIG. 8, 30.1, 33.1; 427/376.2, 93, 162, 255; 502/54; 428/420

[56] References Cited

U.S. PATENT DOCUMENTS

| 3,240,568 | 3/1966 | Derby et al. .............................. 117/82 |
| 3,508,894 | 4/1970 | Torok ....................................... 65/30.1 |
| 3,645,812 | 2/1972 | Sussmann .......................... 156/646.41 |

(List continued on next page.)

FOREIGN PATENT DOCUMENTS

| 0658110 | 12/1965 | Belgium .................................. 117/20 |
| 0463543 A1 | 6/1991 | European Pat. Off. . |
| A1043543 | 6/1991 | European Pat. Off. . |
| 1959392 | 11/1969 | Germany . |
| 78-028058 | 3/1978 | Japan . |
| 60-137892 | 12/1983 | Japan . |
| 52-038873 | 9/1993 | Japan . |
| 8002932 | 1/1996 | Japan . |
| WO 94/24505 | 10/1994 | WIPO . |

OTHER PUBLICATIONS

Pamplin, B. "Crystal Growth," Pergamon Press, 2nd edition, 1980, pp. 275–278.

P.S. Ravishankar "Liquid Encapsulated Bridgman (LEB) Method For Directional Solidification of Silicon Using Calcium Chloride" Journal of Crystal Growth, vol. 94 (1989) pp. 62–68.

*Primary Examiner*—Felisa Garrett
*Attorney, Agent, or Firm*—Senniger, Powers, Leavitt & Roedel

[57] ABSTRACT

A crucible in which a semiconductor material is melted and held during a crystal growing process. The crucible includes a body of vitreous silica having a bottom wall and a sidewall formation extending up from the bottom wall and defining a cavity for holding the molten semiconductor material. The sidewall formation has an inner and an outer surface. A first devitrification promoter on the inner surface of the sidewall formation is distributed such that a first layer of substantially devitrified silica is formed on the inner surface of the crucible which is in contact with the molten semiconductor material when the semiconductor material is melted in the crucible during the crystal growing process. A second devitrification promoter on the outer surface of the sidewall formation is distributed such that a second layer of substantially devitrified silica is formed on the outer surface of the crucible when the semiconductor material is melted in the crucible during the crystal growing process. The first substantially devitrified silica layer is such that it promotes uniform dissolution of the inner surface and in so doing significantly reduces the release of crystalline silica particulates into the molten semiconductor material as a crystal is pulled from the molten semiconductor material. The second substantially devitrified silica layer is such that it reinforces the vitreous silica body.

80 Claims, 2 Drawing Sheets

5,976,247
Page 2

U.S. PATENT DOCUMENTS

| | | | |
|---|---|---|---|
| 3,772,134 | 11/1973 | Rau | 138/140 |
| 3,776,809 | 12/1973 | Baumler et al. | 138/140 |
| 4,010,064 | 3/1977 | Patrick et al. | 117/208 |
| 4,028,093 | 6/1977 | Banker et al. | 75/398 |
| 4,028,124 | 6/1977 | Bihuniak et al. | 501/126 |
| 4,047,966 | 9/1977 | Bihuniak et al. | 501/128 |
| 4,102,666 | 7/1978 | Baumler et al. | 65/33.6 |
| 4,104,045 | 8/1978 | Mansmann | 65/440 |
| 4,268,483 | 5/1981 | Davey et al. | 117/209 |
| 4,336,048 | 6/1982 | Van der Steen et al. | 65/17.6 |
| 4,416,680 | 11/1983 | Bruning | 65/144 |
| 4,429,009 | 1/1984 | Pastor et al. | 428/410 |
| 4,935,046 | 6/1990 | Uchikawa et al. | |
| 4,956,208 | 9/1990 | Uchikawa et al. | 428/34.6 |
| 5,053,359 | 10/1991 | Loxley et al. | 501/4 |
| 5,174,801 | 12/1992 | Matsumura et al. | 65/17.3 |
| 5,196,173 | 3/1993 | Arai et al. | 117/213 |

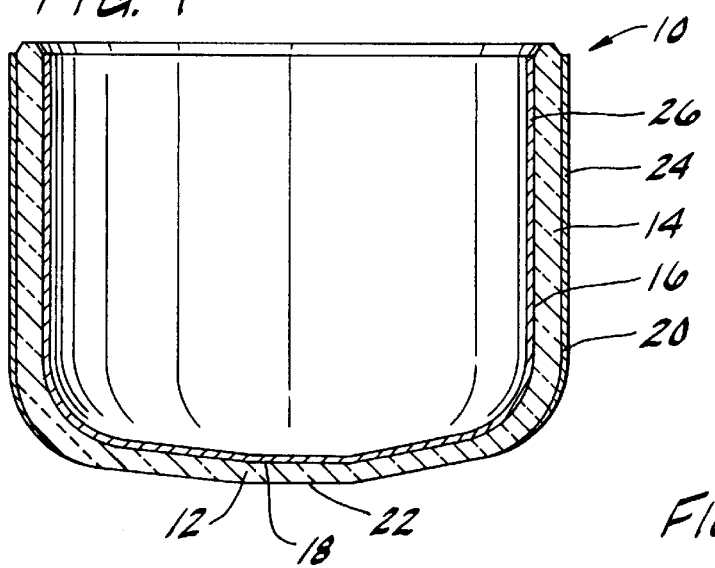
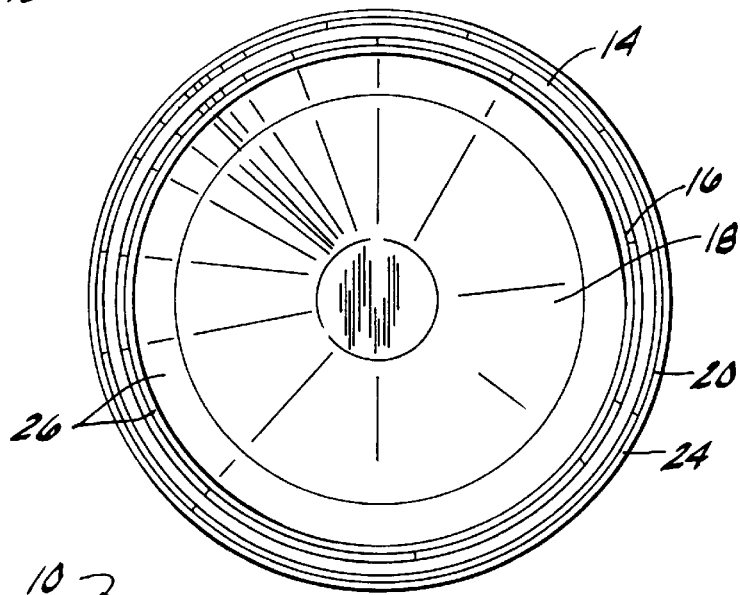
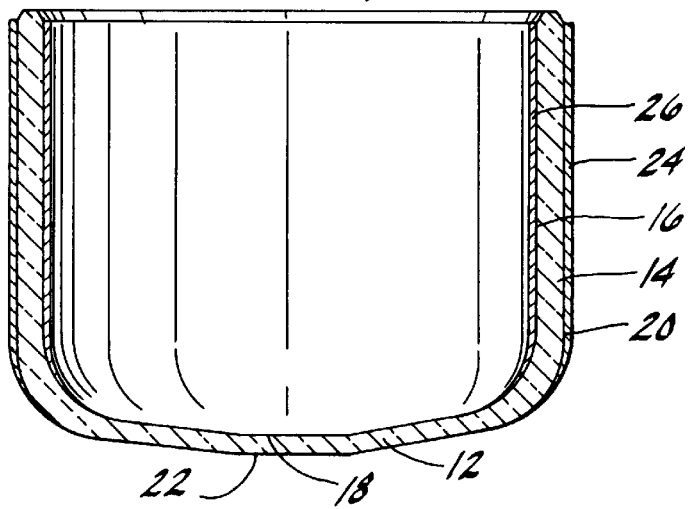

SURFACE-TREATED CRUCIBLES FOR IMPROVED ZERO DISLOCATION PERFORMANCE

BACKGROUND OF THE INVENTION

The present invention relates generally to crucibles for use in the preparation of silicon single crystals grown by the Czochralski process. The invention particularly relates to a fused quartz crucible having one or more surfaces which have been treated with a devitrification promoter.

Single crystal silicon which is the starting material for most processes for the fabrication of semiconductor electronic components is commonly prepared with the so-called Czochralski process. In this process, polycrystalline silicon ("polysilicon") is charged to a crucible, the polysilicon is melted, a seed crystal is immersed into the molten silicon and a single crystal silicon ingot is grown by slow extraction.

The crucible of choice for use in the Czochralski process is commonly referred to as a fused quartz crucible or simply a quartz crucible and is composed of an amorphous form of silica known as vitreous silica. One disadvantage associated with the use of vitreous silica, however, is the fact that contaminants on the inner surface of the crucible can nucleate and promote the formation of cristobalite islands in the vitreous silica surface (the islands being centered, in general, about the contamination site) as the polysilicon is melted and the single crystal ingot is grown. The cristobalite islands can be undercut and released as particles into the silicon melt, causing the formation of dislocations in the silicon ingot. The cristobalite islands can be undercut, for example, by the action of a low melting eutectic liquid formed at the interface between the vitreous silica and cristobalite as described by Liu et al., "Reaction Between Liquid Silicon and Vitreous Silica," *J. Mater. Res.*, 7(2), p. 352 (1992). Other mechanisms by which the cristobalite islands are undercut and released into the melt are also known in the art.

Crucibles formed from vitreous silica may also exhibit a loss of structural integrity when subjected to the extreme temperatures experienced during the melting of the polysilicon charge or the growth of the silicon ingot. In general, these crucibles soften with increasing temperature and are soft enough to easily flow under an applied stress when the crucible wall temperature exceeds 1817° K. Thus, graphite susceptors are frequently used to support the crucibles. Despite such reinforcement, however, quartz crucibles may buckle during the polysilicon melting and the crystal growth phases of the process, or when mechanical failure of the crystal puller occurs resulting in prolonged holding periods at high temperatures. Buckling occurs most often during remelt of an imperfect crystal or melting of bead polysilicon (i.e., granular polysilicon formed in a fluidized bed).

Pastor et al. disclose in U.S. Pat. No. 4,429,009 a process for converting the vitreous silica surface of a crucible to cristobalite for the purpose of passivating and enhancing the stability of the surface. In this process, the vitreous silica surface is exposed to an atmosphere containing atomic iodine at a temperature of 1200° C. to 1400° C. for about 24 hours to convert the surface to β-cristobalite and then cooled to a temperature of less than 260° C. which causes the β-cristobalite to be transformed to α-cristobalite. When the crucible is thereafter reheated to an elevated temperature for use in a crystal growing process, the α-cristobalite layer transforms to β-cristobalite. Experience has shown, however, that the α-cristobalite to β-cristobalite phase transformations cause the devitrified surface to crack and form particulates on the surface. These particulates are released from the devitrified surface into the silicon melt, causing the formation of dislocations in the silicon ingot.

Other methods of treating crucible surfaces have also been proposed. Japanese Kokai No. 52/038873 discloses the use of a xenon lamp to irradiate the inner crucible surface in order to remove electrostatically adhering metallic contaminants to reduce formation of oxidation induced stacking faults in a silicon single crystal. Japanese Kokai No. 60/137892 describes a method of subjecting a crucible to electrolysis to remove alkali metals from the crucible which serves to reduce the incidence of lattice defects and crucible deformation. U.S. Pat. Nos. 4,956,208 and 4,935,046 describe crucibles having an opaque outer shell and an inner transparent quartz layer substantially free from bubbles for controlling the transfer of oxygen into a silicon melt. The inner layer is also described as being effective in suppressing the growth of cristobalite at the crucible-melt interface, preventing the cristobalite from dropping off into the melt and disturbing growth of the crystal. Many of these treatments do not strengthen the walls of the crucible against deformation when subjected to severe temperatures, nor do they control the devitrification process in the presence of molten silicon.

U.S. Pat. No. 4,102,666 describes the formation of a thin crystalline silica layer on the outer surface of a diffusion tube to improve its thermal dimensional stability. The outer surface of the tube is treated with crystallization promoting nuclei such as oxides, carbides or nitrides of boron, aluminum, phosphorus, antimony, zinc, magnesium, calcium, gallium or Group IV elements of the periodic table. The nuclei promote very slow devitrification which is said to increase the useful life of the diffusion tube. The diffusion tubes are used in processing semiconductor wafers at temperatures of up to about 1300° C. which is significantly below the softening point of vitreous silica.

There is a need for quartz crucibles having greater structural stability to prolong the useful life of the crucibles and prevent deformation and buckling of the crucibles during melt down and crystal growth. Crucibles that release fewer particulate contaminants into the silicon melt are also needed to improve the yield and throughput of zero dislocation (i.e., dislocation-free) single crystals grown by the Czochralski process.

SUMMARY OF THE INVENTION

Among the objects of the invention, therefore, may be noted the provision of a crucible having increased structural stability, the provision of a crucible that releases less particulate contaminants into the silicon melt, and the provision of a crucible which provides improved yield and throughput of zero dislocation single crystals grown by the Czochralski process.

The present invention is directed to a crucible in which a semiconductor material is melted and held during a crystal growing process. The crucible includes a body of vitreous silica having a bottom wall and a sidewall formation extending up from the bottom wall and defining a cavity for holding the molten semiconductor material. The sidewall formation has an inner and an outer surface. A first devitrification promoter on the inner surface of the sidewall formation is distributed such that a first layer of substantially devitrified silica is formed on the inner surface of the crucible which is in contact with the molten semiconductor material when the semiconductor material is melted in the crucible during the crystal growing process. A second devitrification promoter on the outer surface of the sidewall formation is distributed such that a second layer of substantially devitrified silica is formed on the outer surface of the crucible when the semiconductor material is melted in the crucible during the crystal growing process. The first substantially devitrified silica layer is such that it promotes uniform dissolution of the inner surface and in so doing significantly reduces the release of crystalline silica particulates into the molten semiconductor material as a crystal is pulled from the molten semiconductor material. The second substantially devitrified silica layer is such that it reinforces the vitreous silica body. In a preferred embodiment, the first and second devitrified silica layers are substantially uniform and continuous.

Other objects and advantages of the invention will be apparent from the following detailed description.

BRIEF DESCRIPTION OF THE DRAWINGS

FIGS. 1 and 2 are schematic vertical sections illustrating internally and externally treated crucibles embodying the present invention;

FIG. 3 is a top view of the crucible of FIG. 2; and

DETAILED DESCRIPTION OF THE PREFERRED EMBODIMENTS

Figure 4:
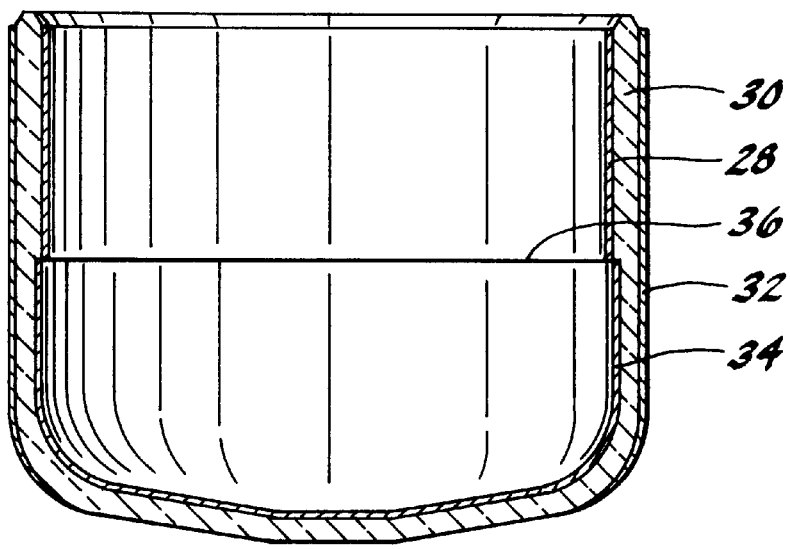
FIGS. 4 and 5 are schematic vertical sections illustrating internally and externally devitrified crucibles embodying the invention.

In accordance with the present invention, it has been discovered that the yield and throughput of dislocation-free silicon single crystals is significantly improved by uniformly coating at least one surface of a conventional fused quartz crucible with a devitrification promoter before the crucible is filled with silicon or otherwise used in a Czochralski process. The deposited devitrification promoter provides nucleation sites on the surface of the crucible. During the Czochralski process, in general, and the melting of the polysilicon, in particular, stable crystal seed nuclei form at these nucleation sites and the vitreous silica at the crucible surface crystallizes, forming a substantially uniform and continuous devitrified shell of β-cristobalite on the surface of the crucible. When the devitrified shell is formed on the outer surface of the crucible, the shell strengthens the crucible and maintains its shape. The surface treated crucible does not deform or buckle because the devitrified shell has a melting point of about 2000° K., which exceeds both the maximum temperature employed in a Czochralski process and the softening point of vitreous silica (1817° K.). A substantially uniform and continuous devitrified shell formed on the inner surface of the crucible dissolves uniformly when in contact with a silicon melt. Dislocations formed in a growing crystal are thus minimized when an internally surface-treated crucible is used because β-cristobalite particles are not released into the melt by the devitrified shell.

Turning now to FIG. 1, there is shown a crucible 10 having a bottom wall 12 and a sidewall formation 14 extending up from the bottom wall 12 and defining a cavity for holding molten semiconductor material. The sidewall formation 14 and bottom wall 12 have respective inner surfaces 16, 18, and outer surfaces 20, 22. An external coating 24 (not to scale) is on the outer surface 20 and forms a layer having a high density of nucleation sites which surrounds the exterior of the sidewall formation 14. An internal coating 26 (not to scale) covers the inner surfaces 16, 18, forming a layer having a high density of nucleation sites covering the interior of the crucible 10. Coatings 24, 26 include a devitrification promoter.

When the crucible is heated to melt the polysilicon during the Czochralski process, the devitrification promoter reacts with the vitreous silica to form crystalline nuclei on the surfaces of the crucible. A promoter containing barium, for example, reacts with vitreous silica to form crystalline nuclei on a crucible surface when the crucible is heated to a temperature in excess of about 600° C. As the melting process continues, the silicon melt and the graphite susceptor act as a reducing agent and promote the rapid growth of these crystalline nuclei at the surface in a radial direction from the nucleation sites. In the presence of the silicon melt or the graphite susceptor, these crystalline nuclei grow to confluence, that is, a continuous ceramic shell is formed on the crucible.

Figure 5:
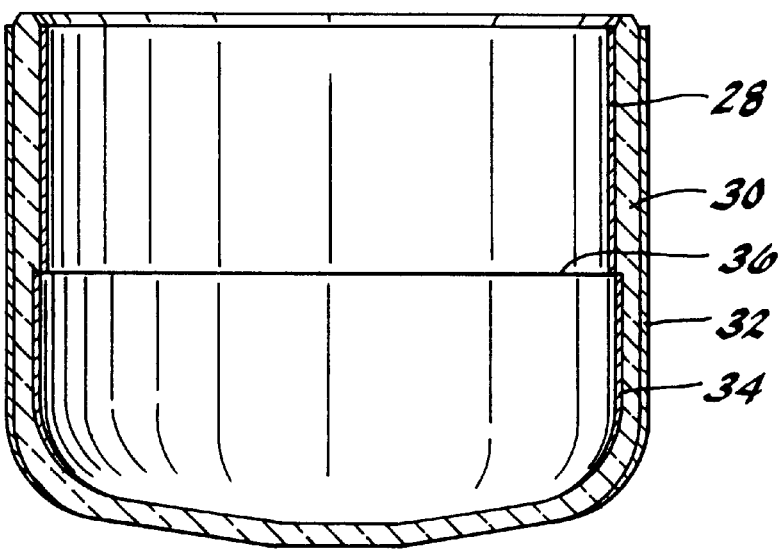

Some devitrification promoters such as barium are released into the silicon melt where the promoters come into contact with the melt. The remainder of the devitrification promoter, however, remains adhered to the upper portion of the inner surface 16, forming a layer 28 which does not devitrify as shown in FIGS. 4 and 5.

When the outer surface of the sidewall formation 30 comprises a devitrified surface 32, this surface reinforces the fused quartz crucible. In addition, an inner devitrified surface 34, which forms on the portion of the sidewall formation 30 in contact with the silicon melt 36, inhibits the formation of melt borne crystalline silica particulates while growing a silicon single crystal.

The outer devitrified surface 32 and the inner devitrified surface 34 are layers of substantially devitrified silica. For purposes of the present invention, substantially devitrified silica can be entirely composed of devitrified silica. Such a layer would be formed when the inner surface of the crucible is uniformly coated with the devitrification promoter. Alternatively, the substantially devitrified silica can primarily contain devitrified silica with some exposed islands of vitreous silica in the otherwise continuous devitrified layer. Such a layer would be formed when minor portions of the inner surface of the crucible are not coated with the devitrification promoter during the coating process. Vitreous silica islands would not significantly contaminate the melt with crystalline particulates because the vitreous islands would not undermine the surrounding devitrified silica to cause it to be released into the melt.

In an alternative embodiment illustrated in FIGS. 2 and 3, the internal coating 26 (not to scale) covers the inner surface 16 of the sidewall formation 14. The inner surface 18 of the bottom wall 12 is uncoated. When granular polycrystalline silicon is stacked within a crucible, argon gas from the surrounding atmosphere is present between the silicon beads. As the silicon is melted, the argon gas becomes trapped at the crucible surface by the melt. The bubbles are released and travel to the melt surface prior to crystal growth when the inner surface of the crucible is uncoated. However, the bubbles are released into the melt during crystal growth and incorporated into the crystal as they reach the melt-crystal interface when the crucible has an inner coating on the sidewall formation 14 and bottom wall 12. The argon bubbles remain trapped within the melt on the coated bottom wall for a longer period of time because the coated surface has a higher surface tension than an uncoated bottom wall surface. Argon gas entrapped within a growing crystal forms void defects in the crystal. It has been discovered that argon is not trapped in the crystal during crystal growth in large diameter (i.e., 45.72 cm (18 inch) and 55.88 cm (22 inch)

diameter) crucibles if the inner surface 16 of the sidewall formation 14 is coated and the inner surface 18 of the bottom wall 12 remains uncoated. The outer surface 20 of the crucible can be coated or uncoated. In a small crucible having a 35.56 cm (14 inch) or 30.48 cm (12 inch) diameter, it has been found that argon bubbles are trapped in the crystal during crystal growth when the inner surfaces 16, 18 of the crucible are uncoated. The outer surface 20 is preferably coated to prevent the small crucible from buckling.

Although the crucible 10 includes coatings 24, 26 as shown in FIGS. 1 and 2, zero dislocation yield and throughput are also improved when only the internal coating 26 or the external coating 24 is applied to the crucible. It is preferred that the outer surface 22 of the bottom wall 12 remains uncoated as shown in FIGS. 1 and 2. Coating the outer surface 22 increases the cost of the crucible without improving crucible performance.

The coatings 24, 26 each contain at least one devitrification promoter which provides crystal nucleation sites on the surfaces 16, 18, 20, 22 of the crucible 10. Devitrification promoters suitable for coating the interior or exterior surfaces of the crucibles of the present invention include alkaline-earth metal oxides, carbonates, hydroxides, oxalates, silicates, fluorides, chlorides, and peroxides, boron trioxide, and phosphorus pentoxide. Some devitrification promoters, such as titanium dioxide, zirconium dioxide, ferric oxide, ion pairs of an alkaline-earth metal cation and an organic anion including alkaline-earth metal formates, acetates, propionates, salicylates, stearates and tartrates, and promoters containing transition metals, refractory metals, lanthanides or actinides, can be used to coat the outer surfaces 20, 22 but are not preferred for coating inner surfaces; these promoters can cause crystal defects or reduce device lifetime if applied to the inner surfaces 16, 18 of a crucible. Copper, sodium and alkali metals are particularly unsuitable for coating interior or exterior surfaces of the crucible. Although these devitrification promoters could be used in preparing the crucibles of the present invention, others which do not cause defects in the crystal or reduce device lifetime if incorporated into the crystal are preferred.

The devitrification promoter is preferably an alkaline-earth metal selected from the group consisting of calcium, barium, magnesium, strontium and beryllium. The alkaline-earth metal can be in any form which adheres to the crucible surfaces. The alkaline-earth metal can be in the form of the element (e.g. Ba), a free ion (e.g. $Ba^{2+}$), or an ion pair with an organic anion such as an oxide, hydroxide, peroxide, carbonate, silicate, oxalate, formate, acetate, propionate, salicylate, stearate, tartrate, fluorine, or chlorine. Preferably, the devitrification promoter is an oxide, hydroxide, carbonate or silicate of an alkaline-earth metal.

The coatings 24, 26 must contain sufficient devitrification promoter to nucleate a layer of substantially devitrified silica. A concentration of at least about 0.10 mM of alkaline-earth metal per thousand square centimeters generally provides a uniform coating capable of promoting devitrification. If a weaker concentration is used, the nuclei may be too small to grow at a rate exceeding dissolution by the melt. Consequently, the nuclei are dissolved before crystallization occurs, particularly in a large diameter (e.g., 55.88 cm) crucible with a higher temperature melt at the crucible wall. When the interior surface of a crucible is coated, the concentration must be low enough to prevent impurities within the coating composition from contaminating the melt and causing poor minority carrier lifetime and oxygen induced stacking faults. In general, therefore, it is preferred that the concentration of alkaline-earth metal applied to the interior of the crucible not exceed about 50 mM per thousand square centimeters of surface area to be coated. Although concentrations greater than 50 mM alkaline-earth metal per thousand square centimeters can be applied to the exterior of a crucible without great concern of contaminating the melt, experience to date has shown that the performance of the crucible is not improved at greater concentrations. Preferably, the concentration of alkaline-earth metal deposited on the inner surface of the crucible ranges from about 0.10 mM/1000 $cm^2$ to about 0.60 mM/1000 $cm^2$ and, more preferably, ranges from about 0.15 mM/1000 $cm^2$ to about 0.30 mM/1000 $cm^2$. An externally coated crucible preferably has an alkaline-earth metal concentration ranging from about 0.10 mM/1000 $cm^2$ to about 1.2 mM/1000 $cm^2$ and, more preferably ranges from about 0.30 mM/1000 $cm^2$ to about 0.60 mM/1000 $cm^2$.

When the interior of the crucible is coated, the devitrification promoter most preferably has a segregation coefficient less than $2.25 \times 10^{-8}$, indicating that the concentration of impurities within a grown crystal will be less than 0.05 parts per trillion atomic ($2.5 \times 10^9/cm^3$). The most preferred devitrification promoter is barium, which is not readily incorporated in a growing crystal even when a considerable amount of barium is present within a silicon melt. Calcium can be an unsuitable devitrification promoter when used in coating the interior of a crucible because it is incorporated into a crystal at a higher concentration than barium at the same melt concentrations and can cause defects in the crystal.

When the exterior of the crucible is coated, the segregation coefficient of the devitrification promoter is insignificant because impurities on the crucible exterior generally do not affect the purity of the silicon single crystal.

The surface-treated crucibles of the present invention are prepared by applying a coating containing the devitrification promoter to a surface of a conventional fused quartz crucible. Any fused quartz crucible that can be used in a Czochralski process can be surface-treated in accordance with the present invention. Suitable crucibles are commercially available from manufacturers including General Electric Company and Toshiba Ceramics, or can be manufactured according to known methods, such as the method described in U.S. Pat. No. 4,416,680. Many commercially available crucibles have been treated to reduce the alkali metal concentration in the crucible. However, some of the crucibles have sodium, potassium and other alkali metals concentrated on their outer surfaces because of incomplete removal during treatment. Alkali metals are preferably removed from the outside surface of a crucible before an external coating is applied to the crucible. If the alkali metals are not removed prior to applying the coating, the devitrified shell formed in accordance with the present invention may be separated from the crucible by a layer of low melting silicates. Devitrification proceeds very quickly as the crystal is grown and the crucible may buckle away from the devitrified shell.

A crucible surface can be coated by any method which deposits the devitrification promoter onto the surface, such as drip coating or spray coating processes. A crucible is drip coated by dripping an aqueous or solvent based solution of a devitrification promoter onto the surface and decanting off the water or solvent after the promoter has adhered to the crucible surface. For example, an aqueous solution containing a barium oxide, hydroxide, peroxide, carbonate, silicate, oxalate, formate, acetate, propionate, salicylate, stearate, tartrate, fluoride, or chloride devitrification promoter can be used to coat the crucible surface. A suitable solution contains 2 mM barium hydroxide octahydrate per 21 ml water. The solution is dripped onto the surface of the crucible as the crucible is rotated to distribute the solution evenly across the surface. The barium hydroxide reacts with carbon dioxide in the air and precipitates as barium carbonate onto the crucible surface as water and soluble impurities are decanted off of the crucible. The barium hydroxide reacts with ambient or applied carbon dioxide gas to form the less soluble barium carbonate. Once the barium carbonate dries on the surface, the crucible can be stored for later use in a Czochralski process.

Although not preferred, acid solutions or salt solutions can also be drip coated onto a crucible surface and the devitrification promoter can be precipitated onto the surface.

When the inner surface of the bottom portion of the crucible (as shown in FIGS. 2 and 3) is not to be coated, the crucible is positioned so that the solution will not drip onto the inner surface. Alternatively, the entire inner surface of the crucible can be coated and the inner surface of the bottom portion can be etched with hydrochloric acid and water and then rinsed to remove the barium as barium chloride which is very soluble in water.

The drip coating method is preferred when treating the interior surface of a crucible because most of the impurities in the aqueous solution are decanted off and do not adhere to the crucible surface.

Another method for coating a crucible surface involves spraying a heated crucible with a solution containing a devitrification promoter to adhere the promoter to the crucible surface. In a preferred spray coating method, carbon dioxide gas and the barium hydroxide solution described above are simultaneously sprayed onto a crucible that has been heated to about 200 to about 300° C. The barium hydroxide immediately adheres to the crucible surface and is partially converted to barium carbonate upon contact with the carbon dioxide. The surface is then simultaneously sprayed with water and carbon dioxide gas to complete the conversion of barium hydroxide to barium carbonate. Sufficient conversion is obtained once the pH of the coated surface is 9.5 or lower, preferably below about 8.

The spray coating method is preferred for coating the exterior of the crucible. Heating the crucible provides better adherence of the devitrification promoter and improves safety by reducing the risk of inhalation and ingestion of the promoter. A spray coated crucible also has a more uniformly coated surface and can be transported without the coating being abraded off during transit. Although the spray coating method generally introduces more impurities onto the surface, such contamination of the exterior of the crucible does not affect the purity of the silicon single crystal.

When the crucible formed by either method is used in a Czochralski process, the crucible is filled with polysilicon and heated to melt the polysilicon. The alkaline-earth metal or other devitrification promoter creates nucleation sites as the crucible is heated to the melt temperature. For example, barium carbonate becomes unstable as the crucible is heated and converts to barium oxide which readily reacts with silica on the crucible surface to form barium silicate. The barium creates nucleation sites once the crucible is heated to about 600° C. Crystallization occurs at the nucleation sites as the silicate is heated, and continues throughout the crystal growth process, forming a ceramic shell on the crucible surface.

Although the alkaline-earth metal hydroxide solution is preferred in coating crucibles of the invention, oxalate, oxide, peroxide, halide, propionate, salicylate, formate, acetate, stearate, tartrate, carbonate and silicate solutions can also be directly applied to the crucibles via the spray coating or drip coating methods. If an alkaline-earth metal carbonate or oxalate is applied to the surface, the carbonate or oxalate converts to an oxide as described above. The oxide then reacts with the silica crucible to form a silicate. The silicate crystallizes at the nucleation sites formed by the alkaline-earth metal or metal-oxide.

The following examples are presented to describe preferred embodiments and utilities of the present invention and are not meant to limit the present invention unless otherwise stated in the claims appended hereto.

EXAMPLE 1

Internally Treated 35.56 cm Diameter Crucibles with Chunk Polysilicon Charge

Surface-treated crucibles were prepared from commercially available vitreous quartz crucibles having a diameter of 35.56 cm (14 inches) and a height of 30.48 cm (12 inches). Each crucible was prepared by dripping an aqueous barium hydroxide solution onto the inner surface (i.e., the side and bottom portions) of the crucible as the crucible was rotated. Barium carbonate formed, separated from the solution, and coated the inner surface of the crucible. The excess solution was decanted off and the crucible was dried, resulting in a coating of about 2 mM barium on the inner surface of the crucible.

The surface-treated crucibles and standard crucibles were each charged with about 36 kg chunk polysilicon and 1.4 g of p-type dopant alloy and were then placed in standard crystal pullers available from the Hamco Division of Kayex Corporation. Each crucible was heated to about 1500° C. until the polysilicon melted. A conventional Czochralski crystal pulling process was then initiated. The crucible began to rotate and the seed crystal was dipped into the melt. As the molten silicon began to crystallize onto the seed crystal, the seed was lifted at a rate sufficient to form a neck portion of the crystal. The pulling rate was then gradually decreased until the ingot diameter was about 152.4 mm (six inches). The pull rate was maintained until most of the silicon was consumed. Then, the pull rate and temperature were increased to form the tail end of the crystal ingot. The power supplied to the puller was then discontinued, the system was cooled, and the ingot was removed.

The crystals were analyzed to determine their zero dislocation length. The zero dislocation length is the number of inches of single crystal ingot which are pulled without dislocations in the crystal lattice. The zero dislocation yield is the zero dislocation length per kilograms of polysilicon charged to the crucible prior to melt down. Zero dislocation throughput is defined as the zero dislocation length per hours required to complete the run (i.e., the time ranging from set up of the system to obtaining a cooled crystal ingot).

Table 1 indicates the average zero dislocation length obtained during 43 runs using surface-treated crucibles in accordance with the present invention, and 44 runs using commercially available vitreous crucibles. One run using a surface-treated crucible and six runs using standard crucibles are not considered in Table 1 because of power failure or unrelated process upsets. Additionally, two surface-treated crucible runs and one standard crucible run were eliminated because a zero dislocation loss occurred when a substantial melt remained in the crucible due to mechanical problems with the pulling apparatus. The grown crystal was withdrawn from the crystal puller and removed. A new seed was inserted into the melt and crystal growth was restarted.

TABLE 1

| Zero Dislocation Length (in) | Crystals Grown In Internally Coated Crucibles | Crystals Grown In Standard Crucibles |
|---|---|---|
| 0 | 2 | 5 |
| 3.0–9.99 | 1 | 3 |
| 10.0–14.99 | 2 | 2 |
| 15.0–19.99 | 8 | 6 |
| 20.0–24.99 | 16 | 11 |
| 25.0–26.50 | 11 | 10 |

Table 2 compares the zero dislocation yield and throughput for surface-treated crucibles and standard crucibles. Yield and throughput were improved by 17.5–24.6% and 15–21%, respectively, by internally treating the crucibles prior to use.

TABLE 2

| Crucible Type | Zero Dislocation Yield[2] (in/kg) | Zero Dislocation Throughput[2] (in/hr) |
|---|---|---|
| Internally Treated | 124.6% | 121% |
| Standard | 100% | 100% |
| Internally Treated[1] | 127.5% | 124% |
| Standard[1] | 110% | 109% |

[1]Runs involving power failure or unrelated process upsets were eliminated.
[2]Relative to standard crucible not adjusted for process upsets.

EXAMPLE 2

Partially Internally Surface-treated 55.88 cm Inch Diameter Crucibles with Granular Polysilicon Charge Six commercially available quartz crucibles of 55.88 cm (22 inch) diameter and 43.18 cm (17 inch) height were internally surface-treated as described in Example 1. Additionally, six partially surface-treated 55.88 cm diameter crucibles were prepared by drip coating the interior side wall surfaces with the barium hydroxide solution; the inner surface of the bottom wall remained uncoated. Each crucible was loaded with 100 kg of granular polysilicon. Twenty standard 55.88 cm diameter quartz crucibles were loaded with 100 kg of chunk polysilicon. The polysilicon within each crucible was melted, and silicon single crystal ingots were grown from the melt by a conventional Czochralski process as previously described.

The ingots were analyzed under infrared light using a conventional infrared video camera scanner to detect large voids within the crystal resulting from pockets of argon gas trapped within the crystal during growth. The results of the infrared scanner testing are summarized in Table 3:

TABLE 3

| Crucible Type | Charge | Average Voids Per Ingot | Range Per Ingot | No. of Ingots Analyzed |
|---|---|---|---|---|
| Internally Treated | Chunk Polysilicon | 0 | — | 20 |
| Internally Treated | Granular Polysilicon | 9.5 | 0–22 | 6 |
| Partially Internally Treated | Granular Polysilicon | 1.5 | 0–3 | 6 |

When the ingots were pulled from melts formed from granular polysilicon retained in internally surface-treated crucibles, large voids were detected within the ingots. However, crystals grown from a crucible having coated inner side wall surfaces and an uncoated bottom wall surface had about six times fewer voids than crystals grown from internally surface-treated crucibles.

EXAMPLE 3

Internally Surface-treated 35.56 cm Diameter Crucibles with Granular Polysilicon Charge Two hundred fifteen standard 35.56 cm (14 inch) diameter quartz crucibles were loaded with 26 kg of granular polysilicon. 130 internally surface-treated 35.56 cm diameter crucibles were prepared by drip coating the interior side wall surfaces and bottom wall surfaces with 21 ml of a 0.1 M barium hydroxide solution. Eighty-four of the crucibles were each loaded with 21 kg of granular polysilicon and 5 kg of chunk polysilicon; the remaining 44 crucibles were each loaded with 26 kg of granular polysilicon. After the polysilicon was melted, a single crystal ingot was pulled from the polysilicon melt within each crucible via a Czochralski process.

The ingots were sliced and visually analyzed to determine whether voids were present on the surfaces of each slice. Slices having voids on their surfaces were rejected as being commercially unacceptable. The zero dislocation yield, throughput and percentage of slices rejected are summarized in Table 4:

TABLE 4

| Crucible | Charge | Zero Dislocation Yield[1] (in/kg) | Zero Dislocation Throughput[1] (in/hr) | % Rejected Slices |
|---|---|---|---|---|
| Standard | Granular Polysilicon | 100% | 100% | 0.19 |
| Internally Treated | 80% Granular/ 20% Chunk Polysilicon | 102% | 99% | 1.55 |
| Internally Treated | Granular Polysilicon | 97% | 88% | 2.28 |

[1]Relative to standard crucible, granular polysilicon.

When crystals are grown from granular polysilicon charge, the crystals grown in standard crucibles have voids at 0.1 times crystals grown in internally-treated crucibles. No statistically significant difference exists between the zero dislocation yield and throughput for the standard and internally-treated crucibles.

EXAMPLE 4

Externally Surface-treated 35.56 cm Diameter Crucibles with Granular Polysilicon Charge Five standard 35.56 cm (14 inch) diameter quartz crucibles were loaded with 34 kg of granular polysilicon. The polysilicon was melted and a Czochralski crystal pulling operation as described in Example 1 was initiated. In three of the runs, crystal growth was terminated after the crucible deformed and buckled during crystal growth.

Two hundred forty externally surface-treated 35.56 cm diameter crucibles were prepared by drip coating the exterior side wall surfaces of a standard crucible with 10.5 ml of a 0.05 M barium hydroxide solution. Each crucible was loaded with 34 kg of granular polysilicon. One hundred twenty-nine internally surface-treated 35.56 cm diameter crucibles were prepared by drip coating the interior side wall surfaces and bottom wall surfaces with 21 ml of a 0.1 M barium hydroxide solution. Each crucible was loaded with 24 kg of granular polysilicon and 10 kg of chunk polysilicon. After the polysilicon was melted, a single crystal ingot was pulled from the polysilicon melt within each crucible. The total length of zero dislocation crystal, zero dislocation yield and throughput are summarized in Table 5:

TABLE 5

| Crucible | Charge | Zero Dislocation Yield[2] (in/kg) | Zero Dislocation Throughput[2] (in/hr) |
|---|---|---|---|
| Standard | Granular Polysilicon | Not Analyzed[1] | Not Analyzed[1] |
| Externally Treated | Granular Polysilicon | 100% | 100% |
| Internally Treated | 70% Granular/30% Chunk Polysilicon | 103% | 98% |

[1]Three of five crucibles buckled during crystal growth.
[2]Relative to externally treated, granular polysilicon.

Standard crucibles generally buckled during CZ crystal growth when charged with granular polysilicon. Such buckling was not observed when the crucibles were externally surface-treated. Crystals grown in the externally treated crucibles were also found to have significantly fewer voids as compared to crystals grown in the internally treated crucibles without a loss of zero dislocation yield or throughput in leaving the crucible interior untreated.

EXAMPLE 5

Internally and Externally Surface-Treated 55.88 cm Diameter Crucibles with Chunk Polysilicon Charge Forty-eight standard 55.88 cm diameter crucibles were internally treated as described in Example 1. Sixteen of the crucibles were also externally treated as described in Example 2. Each of the crucibles was loaded with 100 kg of chunk polysilicon. Silicon single crystal 200 mm diameter ingots were grown via a conventional Czochralski method as previously described.

The relative zero dislocation yields for the internally surface-treated crucibles and the internally and externally surface-treated crucibles were 100% and 110%, respectively. The zero dislocation yield was improved by about 9.8% by externally coating a crucible in addition to internal surface treatment.

While the invention is susceptible to various modifications and alternative forms, specific embodiments thereof have been shown by way of example in the drawings and have been described herein in detail. It should be understood, however, that it is not intended to limit the invention to the particular form disclosed, but on the contrary, the intention is to cover all modifications, equivalents and alternatives falling within the spirit and scope of the invention as defined by the appended claims.

We claim:

1. A crucible in which a semiconductor material is melted and held during a crystal growing process, the crucible comprising
   a body of vitreous silica having a bottom wall and a sidewall formation extending up from the bottom wall and defining a cavity for holding the molten semiconductor material, the sidewall formation and the bottom wall each having an inner and an outer surface; and
   a first devitrification promoter on the inner surface of the sidewall formation, the inner surface of the bottom wall lacking the first devitrification promoter, the distribution of first devitrification promoter on the inner surface of the sidewall formation being such that a first layer of substantially devitrified silica is formed on the inner surface of the crucible which is in contact with the molten semiconductor material when the semiconductor material is melted in the crucible during the crystal growing process.

2. A crucible in which a semiconductor material is melted and held during a crystal growing process, the crucible comprising
   a body of vitreous silica having a bottom wall and a sidewall formation extending up from the bottom wall and defining a cavity for holding the molten semiconductor material, the sidewall formation and the bottom wall each having an inner and an outer surface;
   a first devitrification promoter on the inner surface of the sidewall formation, the inner surface of the bottom wall lacking the first devitrification promoter, the distribution of first devitrification promoter on the inner surface of the sidewall formation being such that a first layer of substantially devitrified silica is formed on the inner surface of the crucible which is in contact with the molten semiconductor material when the semiconductor material is melted in the crucible during the crystal growing process; and
   a second devitrification promoter on the outer surface of the sidewall formation, the distribution of second devitrification promoter on the outer surface of the sidewall formation being such that a second layer of substantially devitrified silica is formed on the outer surface of the crucible when the semiconductor material is melted in the crucible during the crystal growing process.

3. The crucible of claim 2 wherein the first devitrification promoter includes an alkaline-earth metal selected from the group consisting of barium, magnesium, strontium and beryllium, and the second devitrification promoter includes an alkaline-earth metal selected from the group consisting of calcium, barium, magnesium, strontium and beryllium.

4. The crucible of claim 3 wherein the first and second devitrification promoters include barium.

5. The crucible of claim 3 wherein the first and second devitrification promoters are, individually, an oxide, hydroxide, carbonate, oxalate, silicate, peroxide, fluoride or chloride of the alkaline-earth metal.

6. The crucible of claim 3 wherein the concentration of the first and second devitrification promoters is from about 0.1 mM to about 50 mM alkaline-earth metal per thousand square centimeters of the surface.

7. The crucible of claim 3 wherein the concentration of the first devitrification promoter is from about 0.1 mM to about 0.6 mM of alkaline-earth metal per thousand square centimeters of the inner surface, and the concentration of the second devitrification promoter is from about 0.1 mM to about 12 mM of alkaline-earth metal per thousand square centimeters of the outer surface.

8. The crucible of claim 3 wherein the concentration of the first devitrification promoter is from about 0.15 mM to about 0.3 mM of alkaline-earth metal per thousand square centimeters of the inner surface, and the concentration of the second devitrification promoter is from about 0.3 mM to about 0.6 mM of alkaline-earth metal per thousand square centimeters of the outer surface.

9. The crucible of claim 2 wherein the second devitrification promoter does not cover the outer surface of the bottom wall.

10. The crucible of claim 2 wherein the outer surface of the crucible is substantially free of alkali metals.

11. The crucible of claim 2 wherein the molten semiconductor material is silicon.

12. A crucible in which a semiconductor material is melted and held during a crystal growing process, the crucible comprising a body of vitreous silica having a bottom wall and a sidewall formation extending up from the bottom wall and defining a cavity for holding the molten semiconductor material, the sidewall formation and the bottom wall each having an inner and an outer surface;

a first devitrification promoter on the inner surface of the sidewall formation, the distribution of first devitrification promoter on the inner surface of the sidewall formation being such that a first layer of substantially devitrified silica is formed on the inner surface of the crucible which is in contact with the molten semiconductor material when the semiconductor material is melted in the crucible during the crystal growing process; and a second devitrification promoter on the outer surface of the sidewall formation, the distribution of second devitrification promoter on the outer surface of the sidewall formation being such that a second layer of substantially devitrified silica is formed on the outer surface of the crucible when the semiconductor material is melted in the crucible during the crystal growing process.

13. A crucible in which a semiconductor material is melted and held during a crystal growing process, the crucible comprising a body of vitreous silica having a bottom wall and a sidewall formation extending up from the bottom wall and defining a cavity for holding the molten semiconductor material, the sidewall formation and the bottom wall each having an inner and an outer surface;

a first devitrification promoter on the inner surface of the sidewall formation, the distribution of first devitrification promoter on the inner surface of the sidewall formation being such that a first layer of substantially devitrified silica is formed on the inner surface of the crucible which is in contact with the molten semiconductor material when the semiconductor material is melted in the crucible during the crystal growing process; and a second devitrification promoter on the outer surface of the sidewall formation, the distribution of second devitrification promoter on the surface of the sidewall formation being such that a second layer of substantially devitrified silica is formed on the outer surface of the crucible when the semiconductor material is melted in the crucible during the crystal growing process, wherein the first devitrification promoter includes an alkaline-earth metal selected from the group consisting of barium, magnesium, strontium and beryllium, and the second devitrification promoter includes and alkaline-earth metal selected from the group consisting of calcium, barium, magnesium, strontium and beryllium.

14. The crucible of claim 13 wherein the first and second devitrification promoters include barium.

15. The crucible of claim 13 wherein the first and second devitrification promoters are, individually, an oxide, hydroxide, carbonate, oxalate, silicate, peroxide, fluoride or chloride of the alkaline-earth metal.

16. The crucible of claim 13 wherein the concentration of each of the first and second devitrification promoters is from about 0.1 mM to about 50 mM alkaline-earth metal per thousand square centimeters of the surface.

17. The crucible of claim 13 wherein the concentration of the first devitrification promoter is from about 0.1 mM to about 0.6 mM of alkaline-earth metal per thousand square centimeters of the inner surface, and the concentration of the second devitrification promoter is from about 0.1 mM to about 12 mM of alkaline-earth metal per thousand square centimeters of the outer surface.

18. The crucible of claim 13 wherein the concentration of the first devitrification promoter is from about 0.15 mM to about 0.3 mM of alkaline-earth metal per thousand square centimeters of the inner surface, and the concentration of the second devitrification promoter is from about 0.3 mM to about 0.6 mM of alkaline-earth metal per thousand square centimeters of the outer surface.

19. The crucible of claim 13 wherein the first devitrification promoter does not cover the inner or outer surface of the bottom wall.

20. The crucible of claim 13 wherein the first devitrification promoter is on the inner surface of the bottom wall, and the second devitrification promoter does not cover the outer surface of the bottom wall.

21. The crucible of claim 13 wherein the outer surface of the crucible is substantially free of alkali metals.

22. The crucible of claim 13 wherein the molten semiconductor material is silicon.

23. A crucible in which a semiconductor material is melted and held during a crystal growing process, the crucible comprising a body of vitreous silica having a bottom wall and a sidewall formation extending up from the bottom wall and defining a cavity for holding the molten semiconductor material, the sidewall formation and the bottom wall each having an inner and an outer surface;

a first devitrification promoter on the inner surface of the sidewall formation, the distribution of first devitrification promoter on the inner surface of the sidewall formation being such that a first layer of substantially devitrified silica is formed on the inner surface of the crucible which is in contact with the molten semiconductor material when the semiconductor material is melted in the crucible during the crystal growing process, the first substantially devitrified silica layer being such that it promotes uniform dissolution of the inner surface and reduces the release of crystalline silica particulates into the molten semiconductor material as a crystal is pulled from the molten semiconductor material; and a second devitrification promoter on the outer surface of the sidewall formation, the distribution of second devitrification promoter on the outer surface of the sidewall formation being such that a second layer of substantially devitrified silica is formed on the outer surface of the crucible when the semiconductor material is melted in the crucible during the crystal growing process, the second substantially devitrified silica layer being such that it reinforces the vitreous silica body.

24. A crucible in which a semiconductor material is melted and held during a crystal growing process, the crucible comprising a body of vitreous silica having a bottom wall and a sidewall formation extending up from the bottom wall and defining a cavity for holding the molten semiconductor material, the sidewall formation and the bottom wall each having an inner and an outer surface;

a first devitrification promoter on the inner surface of the sidewall formation, the distribution of first devitrification promoter on the inner surface of the sidewall formation being such that a first layer of substantially devitrified silica is formed on the inner surface of the crucible which is in contact with the molten semiconductor material when the semiconductor material is melted in the crucible during the crystal growing process, the first substantially devitrified silica layer being such that it promotes uniform dissolution of the inner surface and reduces the release of crystalline silica particulates into the molten semiconductor material as a crystal is pulled from the molten semiconductor material; and a second devitrification promoter on the outer surface of the sidewall formation, the distribution of second devitrification promoter on the outer surface of the sidewall formation being such that a second layer of substantially devitrified silica is formed on the outer surface of the crucible when the semiconductor material is melted in the crucible during the crystal growing process, the second substantially devitrified silica layer being such that it reinforces the vitreous silica body, wherein the first devitrification promoter includes an alkaline-earth metal selected from the group consisting of barium, magnesium, strontium and beryllium, and the second devitrification promoter includes an alkaline-earth metal selected from the group consisting of calcium, barium, magnesium, strontium and beryllium.

25. The crucible of claim 24 wherein the first and second devitrification promoters include barium.

26. The crucible of claim 24 wherein the first and second devitrification promoters are, individually, an oxide, hydroxide, carbonate, oxalate, silicate, peroxide, fluoride or chloride of the alkaline-earth metal.

27. The crucible of claim 24 wherein the concentration of the first and second devitrification promoters is from about 0.1 mM to about 50 mM alkaline-earth metal per thousand square centimeters of the surface.

28. The crucible of claim 24 wherein the concentration of the first devitrification promoter is from about 0.1 mM to about 0.6 mM of alkaline-earth metal per thousand square centimeters of the inner surface, and the concentration of the second devitrification promoter is from about 0.1 mM to about 12 mM of alkaline-earth metal per thousand square centimeters of the outer surface.

29. The crucible of claim 24 wherein the concentration of the first devitrification promoter is from about 0.15 mM to about 0.3 mM of alkaline-earth metal per thousand square centimeters of the inner surface, and the concentration of the second devitrification promoter is from about 0.3 mM to about 0.6 mM of alkaline-earth metal per thousand square centimeters of the outer surface.

30. The crucible of claim 24 wherein the first devitrification promoter does not cover the inner or outer surface of the bottom wall.

31. The crucible of claim 24 wherein the first devitrification promoter is on the inner surface of the bottom wall, and the second devitrification promoter does not cover the outer surface of the bottom wall.

32. The crucible of claim 24 wherein the outer surface of the crucible is substantially free of alkali metals.

33. The crucible of claim 24 wherein the molten semiconductor material is silicon.

34. A crucible for the containment of molten silicon in a Czochralski process, the crucible comprising a body of vitreous silica having a bottom wall and a sidewall formation extending up from the bottom wall and defining a cavity for holding the molten silicon, the sidewall formation and bottom wall each having an inner and an outer surface;

a first devitrification promoter on the inner surface of the sidewall formation of the crucible in a concentration of between about 0.1 mM/1000 $cm^2$ and about 0.6 mM/1000 $cm^2$ having a segregation coefficient in molten silicon of less than $2.25 \times 10^{-8}$; and a second devitrification promoter on the outer surface of the sidewall formation of the crucible in a concentration of between about 0.1 mM/1000 $cm^2$ and about 1.2 mM/1000 $cm^2$.

35. The crucible of claim 34 wherein the inner surface of the bottom wall lacks the devitrification promoter.

36. The crucible of claim 34 wherein the devitrification promoter comprises an alkaline earth metal selected from the group consisting of barium, magnesium, strontium and beryllium.

37. The crucible of claim 34 wherein the outer surface of the sidewall formation and the outer surface of the bottom wall are substantially free of alkali metals.

38. The use for the containment of molten silicon in a Czochralski process of a crucible, the crucible comprising a body of vitreous silica having a bottom wall and a sidewall formation extending up from the bottom wall and defining a cavity for holding the molten silicon, the sidewall formation and bottom wall each having an inner surface and an outer surface;

a first devitrification promoter on the inner surface of the sidewall formation in a concentration of between about 0.1 mM/1000 $cm^2$ and about 0.6 mM/1000 $cm^2$ having a segregation coefficient in molten silicon of less than about $2.25 \times 10^{-8}$; and a second devitrification promoter on the outer surface of the sidewall formation in a concentration of between about 0.1 mM/1000 $cm^2$ and about 1.2 mM/1000 $cm^2$.

39. The crucible of claim 38 wherein the devitrification promoter is an alkaline earth metal selected from the group consisting of barium, magnesium, strontium, and beryllium.

40. The crucible of claim 38 wherein the devitrification promoter is barium.

41. A crucible in which polycrystalline silicon is melted and held as a molten silicon mass during a process in which a single crystal silicon ingot is pulled by the Czochralski method, the crucible comprising a body having a bottom wall, a sidewall formation which extends up from the bottom wall and defines a cavity for holding the silicon, the sidewall formation and the bottom wall each having inner and outer surfaces, the inner surface of the sidewall formation consisting of exposed layers of vitreous and devitrified silica, the devitrified silica layer comprising a continuous band which extends around the sidewall formation and which extends from the bottom wall to a position along the sidewall formation which is intermediate of the bottom wall and the top of the sidewall formation, the vitreous silica layer comprising a continuous band which extends around the sidewall formation and which extends from the top of the sidewall formation to the position intermediate of the bottom wall and the top of the sidewall formation at which the devitrified layer begins, the outer surface of the sidewall formation comprising an exposed devitrified silica layer, the devitrified layer being a continuous band which extends around the sidewall formation and strengthens the crucible as compared to an otherwise comparable crucible which lacks said exposed devitrified silica layer on the outer surface of the sidewall formation.

42. The crucible of claim 41 wherein the inner surface of the bottom wall is vitreous silica.

43. A crucible in which polycrystalline silicon is melted and held as a molten silicon mass during a process in which a single crystal silicon ingot is pulled by the Czochralski method, the crucible comprising
   a body of vitreous silica having a bottom wall, a sidewall formation which extends up from the bottom wall and defines a cavity for holding the silicon, the sidewall formation and the bottom wall each having inner and outer surfaces,
   a first coating on the inner surface thereof containing at least about 0.1 mM of an alkaline earth metal per thousand square centimeters,
   a second coating on the outer surface thereof containing at least about 0.1 mM of an alkaline earth metal per thousand square centimeters.

44. The crucible of claim 43 wherein the first coating comprises barium.

45. The crucible of claim 44 wherein the second coating comprises barium.

46. The crucible of claim 43 wherein the second coating comprises barium.

47. The crucible of claim 43 wherein the first coating contains about 0.1 mM to about 0.6 mM of an alkaline earth metal per thousand square centimeters of the sidewall formation.

48. The method of claim 47 wherein the second coating comprises barium.

49. The method of claim 48 wherein the first coating contains about 0.1 mM to about 0.6 mM of barium per thousand square centimeters of the sidewall formation.

50. The method of claim 49 wherein the second coating comprises barium.

51. The process of claim 43 wherein the first coating contains about 0.15 mM to about 0.3 mM of an alkaline earth metal per thousand square centimeters of the sidewall formation.

52. The crucible of claim 51 wherein the second coating comprises barium.

53. The crucible of claim 43 wherein the first coating contains about 0.15 mM to about 0.3 mM of barium per thousand square centimeters of the sidewall formation.

54. The crucible of claim 53 wherein the second coating comprises barium.

55. The crucible of claim 43 wherein the inner surface of the bottom wall does not have a devitrification promoter on the surface thereof.

56. The crucible of claim 55 wherein the first coating comprises barium.

57. The crucible of claim 56 wherein the second coating comprises barium.

58. The crucible of claim 55 wherein the second coating comprises barium.

59. The crucible of claim 55 wherein the first coating contains about 0.1 mM to about 0.6 mM of an alkaline earth metal per thousand square centimeters of the sidewall formation.

60. The method of claim 59 wherein the second coating comprises barium.

61. The method of claim 55 wherein the first coating contains about 0.1 mM to about 0.6 mM of barium per thousand square centimeters of the sidewall formation.

62. The method of claim 61 wherein the second coating comprises barium.

63. The process of claim 55 wherein the first coating contains about 0.15 mM to about 0.3 mM of an alkaline earth metal per thousand square centimeters of the sidewall formation.

64. The crucible of claim 63 wherein the second coating comprises barium.

65. The crucible of claim 55 wherein the first coating contains about 0.15 mM to about 0.3 mM of barium per thousand square centimeters of the sidewall formation.

66. The crucible of claim 65 wherein the second coating comprises barium.

67. A crucible in which polycrystalline silicon is melted and held as a molten silicon mass during a process in which a single crystal silicon ingot is pulled by the Czochralski method and in which the crucible is in contact with a graphite susceptor, the crucible comprising
   a body of vitreous silica having a bottom wall, a sidewall formation which extends up from the bottom wall and defines a cavity for holding the silicon, the sidewall formation and the bottom wall each having inner and outer surfaces,
   a first devitrification promoter on the inner surface of the sidewall formation, the distribution of the first devitrification promoter being such that a devitrified shell of $\beta$-cristobalite is formed on the inner surface of the heated crucible which is in contact with the molten silicon mass when the semiconductor material is melted in the crucible and the single crystal silicon ingot is pulled, and
   a second devitrification promoter on the outer surface of the sidewall formation, the distribution of the second devitrification promoter being such that a devitrified shell of $\beta$-cristobalite is formed on the outer surface of the heated crucible which contacts the graphite susceptor when the semiconductor material is melted in the crucible and the single crystal silicon ingot is pulled.

68. The crucible of claim 67 wherein the first devitrification promoter comprises an alkaline-earth metal selected from the group consisting of barium, magnesium, strontium and beryllium.

69. The crucible of claim 68 wherein the first devitrification promoter is an oxide, hydroxide, carbonate, oxalate, silicate, peroxide, fluoride or chloride of the alkaline-earth metal.

70. The crucible of claim 67 wherein the second devitrification promoter comprises an alkaline-earth metal selected from the group consisting of calcium, barium, magnesium, strontium and beryllium.

71. The crucible of claim 67 wherein the second devitrification promoter is an oxide, hydroxide, carbonate, oxalate, silicate, peroxide, fluoride or chloride of the alkaline-earth metal.

72. The crucible of claim 67 wherein the first and second devitrification promoters comprise barium.

73. The crucible of claim 67 wherein the first devitrified shell comprises islands of vitreous silica surrounded by a continuous layer of devitrified silica.

74. The crucible of claim 67 wherein the inner surface of the bottom wall does not have a devitrification promoter on the surface thereof.

75. The crucible of claim 74 wherein the second devitrification promoter comprises an alkaline-earth metal selected from the group consisting of calcium, barium, magnesium, strontium and beryllium.

76. The crucible of claim 75 wherein the second devitrification promoter is an oxide, hydroxide, carbonate, oxalate, silicate, peroxide, fluoride or chloride of the alkaline-earth metal.

77. The crucible of claim 71 wherein the first and second devitrification promoters comprise barium.

78. The crucible of claim 71 wherein the first devitrified shell comprises islands of vitreous silica surrounded by a continuous layer of devitrified silica.

79. The crucible of claim 74 wherein the first devitrification promoter comprises an alkaline-earth metal selected from the group consisting of barium, magnesium, strontium and beryllium.

80. The crucible of claim 79 wherein the first devitrification promoter is an oxide, hydroxide, carbonate, oxalate, silicate, peroxide, fluoride or chloride of the alkaline-earth metal.

* * * * *

UNITED STATES PATENT AND TRADEMARK OFFICE
CERTIFICATE OF CORRECTION

PATENT NO. : 5,976,247

DATED : November 2, 1999

INVENTOR(S) : Richard L. Hansen, Larry E. Drafall, Robert M. McCutchan, John D. Holder, Leon A. Allen, Robert D. Shelley It is certified that error appears in the above-identified patent and that said Letters Patent is hereby corrected as shown below:

In Column 17, line 37, Claim 49 "of claim 48" should read -- of claim 43 --.

In Column 19, line 7, Claim 77 "of claim 71" should read -- of claim 74 --.

In Column 19, line 9, Claim 78 "of claim 71" should read -- of claim 74 --.

Signed and Sealed this

Second Day of January, 2001

*Attest:*

Q. TODD DICKINSON

*Attesting Officer*  *Commissioner of Patents and Trademarks*

UNITED STATES PATENT AND TRADEMARK OFFICE
CERTIFICATE OF CORRECTION

PATENT NO. : 5,976,247
DATED : November 2, 1999
INVENTOR(S) : Richard L. Hansen, Larry E. Drafall, Robert M. McCutchan, John D. Holder, Leon A. Allen, Robert D. Shelley It is certified that error appears in the above-identified patent and that said Letters Patent is hereby corrected as shown below:

Title page,
"[73] Assignee: MEMC Electronic Materials, Inc., St. Peters, Mo." should read
-- [73] Assignee: MEMC Electronic Materials, Inc., St. Peters, MO. and General Electric Company, Cleveland, OH. --.

Signed and Sealed this

Twenty-eighth Day of August, 2001

Attest:

NICHOLAS P. GODICI
Attesting Officer    Acting Director of the United States Patent and Trademark Office